United States Patent
Ahmed et al.

(10) Patent No.: US 11,758,707 B2
(45) Date of Patent: Sep. 12, 2023

(54) SRAM CELL LAYOUT INCLUDING ARRANGEMENT OF MULTIPLE ACTIVE REGIONS AND MULTIPLE GATE REGIONS

(71) Applicant: STMicroelectronics International N.V., Geneva (CH)

(72) Inventors: Shafquat Jahan Ahmed, Greater Noida (IN); Kedar Janardan Dhori, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 252 days.

(21) Appl. No.: 17/118,372

(22) Filed: Dec. 10, 2020

(65) Prior Publication Data

US 2021/0193669 A1 Jun. 24, 2021

Related U.S. Application Data

(60) Provisional application No. 62/950,761, filed on Dec. 19, 2019.

(51) Int. Cl.
*H10B 10/00* (2023.01)

(52) U.S. Cl.
CPC ............. *H10B 10/12* (2023.02); *H10B 10/18* (2023.02)

(58) Field of Classification Search
CPC . H01L 27/1104; H01L 27/1116; H10B 10/12; H10B 10/18; H10B 10/125; H10B 10/00

USPC ......................................................... 257/369
See application file for complete search history.

(56) References Cited

U.S. PATENT DOCUMENTS

| | | | |
|---|---|---|---|
| 5,561,638 A | 10/1996 | Gibson et al. | |
| 6,534,805 B1 | 3/2003 | Jin | |
| 8,723,265 B2 | 5/2014 | Chen et al. | |
| 9,412,742 B2 | 8/2016 | Fujiwara et al. | |
| 9,659,599 B1 * | 5/2017 | Liaw | G11C 8/16 |
| 2015/0357279 A1 * | 12/2015 | Fujiwara | H01L 27/0207 257/499 |
| 2018/0005691 A1 * | 1/2018 | Liaw | G11C 8/16 |

* cited by examiner

*Primary Examiner* — Duy T Nguyen
(74) *Attorney, Agent, or Firm* — Seed IP Law Group LLP

(57) ABSTRACT

A memory cell including a set of active regions that overlay a set of gate regions to form a pair of cross-coupled inverters. A first active region extends along a first axis. A first gate region extends transversely to the first active region and overlays the first active region to form a first transistor of the pair of cross-coupled inverters. A second gate region extends transversely to the first active region and overlays the first active region to form a second transistor of the pair of cross-coupled inverters. A second active region extends along a second axis and overlays the first gate region to form a third transistor of the pair of cross-coupled inverters. A fourth active region extending along a third axis and overlays a gate region to form a transistor of a read port.

20 Claims, 10 Drawing Sheets

SRAM CELL LAYOUT INCLUDING ARRANGEMENT OF MULTIPLE ACTIVE REGIONS AND MULTIPLE GATE REGIONS

BACKGROUND

Technical Field

The present disclosure relates to the field of computer memory and, more particularly, to static random-access memory (SRAM) cell architecture.

Description of the Related Art

Traditional Static Random Access Memory (SRAM) are implemented in many computing environments for characteristics including performance, ease of interfacing, simplicity, relatively low idle power consumption, and robustness. However, one distinct drawback is the area occupied by traditional SRAM layout topologies. The size of such traditional SRAM layouts may be a significant disincentive for applications in which space is an issue.

BRIEF SUMMARY

Briefly stated, the present disclosure includes embodiments directed to memory cell architecture and memory cell arrays having a reduced area and improved performance characteristics. A memory cell according to the present disclosure includes a plurality of gate regions arranged in pitches extending transversely to a first axis of the memory cell. A first active region extends along the first axis and overlays a first gate region in a first pitch and a second gate region extends along a second pitch to form a first transistor and a second transistor of a pair of cross-coupled inverters of the memory cell. A second active region extends along a second axis parallel to the first axis and is spaced apart from the first active region. The second active region overlays the first gate region to form a third transistor of the pair of cross-coupled inverters.

The memory cell may include a third active region that extends along a third axis parallel to the first axis and that is spaced apart from the first active region on a side of the first active region opposite to the second active region. The third active region overlays the second gate region to form a fourth transistor of the pair of cross-coupled inverters. The pair of cross-coupled inverters is thus formed using three active regions instead of four active regions (see FIG. 1), thereby reducing the area occupied by the memory cell.

The second active region, in some embodiments, may overlay the second gate region to form the fourth transistor of the pair of cross-coupled inverters. In such embodiments, the pair of cross-coupled inverters is thus formed using two active regions instead of four active regions (see FIG. 1), thereby reducing the area occupied by the memory cell.

The first active region may extend across an upper edge and a lower edge of the memory cell and into adjacent memory cells. The continuously extending first active region may reduce performance impact caused by shallow trench isolation characteristics.

An array of memory cells may be formed according to the memory cell architectures discussed herein in which an active region—the first active region—extends through memory cells arranged along the first axis. Adjacent memory cells along the first axis may be mirror-images of each other with respect to the edge between the adjacent memory cells.

DETAILED DESCRIPTION

Figure 1:
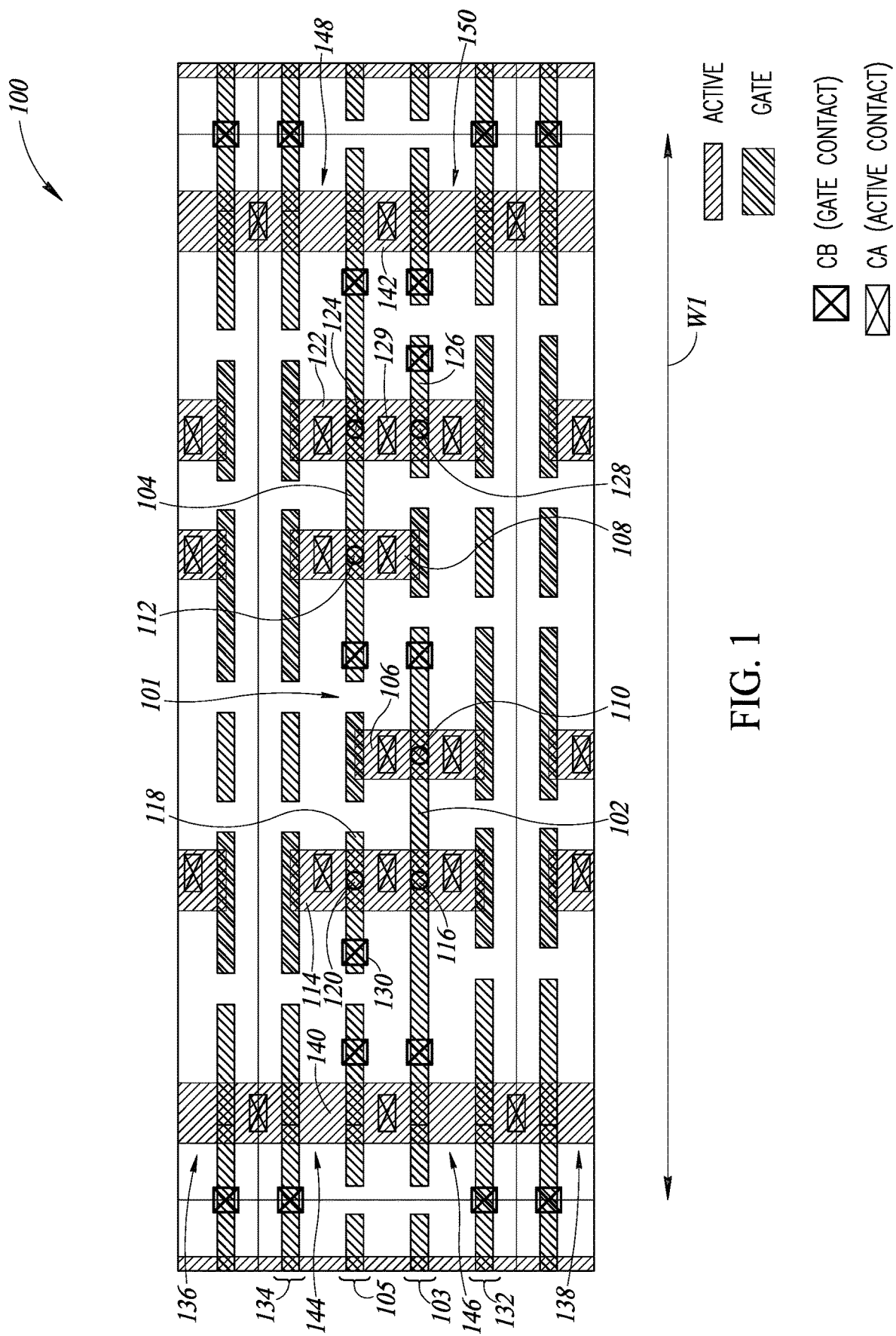
FIG. 1 is a layout diagram of a memory cell of a memory cell array.

Technologies disclosed herein are directed to layout of an SRAM cell and SRAM cell arrays, and interconnections thereof, having a reduced size and improved shallow trench isolation properties relative to alternative layouts. The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, have not been shown or described in order to avoid unnecessarily obscuring descriptions of the embodiments.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

References to the term "set" (e.g., "a set of items"), as used herein, unless otherwise noted or contradicted by context, is to be construed as a nonempty collection comprising one or more members or instances.

The term "overlay," as used herein, refers to an arrangement of at least a first member and a second member in which an axis intersects with a portion of the first member intersects and a portion of the second member. The overlaying portion of the first member and the portion of the second member may be spaced apart from each other along the axis. For example, the first member and the second member may not be in contact to be considered as being overlaying.

The term "active region," as used herein, refers to a continuous region formed of semiconductor materials of p-type and n-type having a structure that depends on the desired operation of the memory cell. The active regions may form one or more PN junctions, such as an N-type channel formed on a P-type substrate or a P-type channel formed on an N-type substrate. Non-limiting examples of semiconductor materials used in the active region include Gallium Arsenide (GaAs), Gallium Nitride (GaN), Aluminum Gallium Nitride (AlGaN), and Indium Phosphide (InP).

The term "gate region," as used herein, refers to a continuous region formed of a silicon material or polysilicon material, which may include a combination of polysilicon and other silicon materials, such as silicides (e.g., cobalt silicide, tantalum silicide, tungsten silicide).

The term "pitch" used herein refers to a row or line along which a plurality of regions (e.g., gate regions) are arranged. The plurality of regions may be initially formed to be a single region extending along the pitch. The single region may then be divided into a plurality of regions spaced apart from each other along the pitch by removing portions of the single region.

FIG. 1 shows a diagram of a layout 100 of at least a part of an SRAM cell. The layout 100 includes a six transistor (6T) write port implemented across two polysilicon pitches. The 6T write port is formed in an SRAM cell 101 and includes a first pair of laterally extending gate regions 102 and 104. The gate region 102 is formed on a first pitch 103 and the gate region 104 is formed on a second pitch 105 spaced apart from the first pitch 103. The layout 100 further includes a first active region 106 extending transversely to an extension of the gate region 102 and a second active region 108 extending transversely to the extension of the second gate region and being separated and spaced apart from the first active region 106. The first active region 106 overlays the gate region 102 to form a first transistor 110 and the second active region 108 overlays the gate region 104 to form a second transistor 112. As shown in the layout 100, the first transistor 110 and the second transistor 112 are formed across the two silicon pitches and spaced apart from each other.

The layout 100 further includes a third active region 114 extending transversely to the extension of the gate region 102 and being laterally and outwardly spaced apart from the first active region 106. The third active region 114 overlays the gate region 102 on the first pitch 103 to form a third transistor 116. A gate region 118 on the second pitch 105 overlays the third active region 114 to form a fourth transistor 120. The third transistor 116 and the fourth transistor 120 are located laterally outward of the first active region 106 and spaced apart from the first transistor 110 on the layout 100.

The layout 100 also includes a fourth active region 122 extending transversely to the extension of the gate region 104 and being laterally and outwardly spaced apart from the second active region 108. The fourth active region 122 overlays the gate region 104 on the second pitch 105 to form a fifth transistor 124. A gate region 126 on the first pitch 103 overlays the fourth active region 122 to form a sixth transistor 128. The fifth transistor 124 and the sixth transistor 128 are located laterally outward of the second active region 108 and spaced apart from the second transistor 112 on the layout 100.

The first transistor 110, the second transistor 112, the third transistor 116, the fourth transistor 120, the fifth transistor 124, and the sixth transistor 128 collectively form a six transistor (6T) write port of the SRAM cell in the layout 100. As shown, the six transistors are formed on the two pitches 103 and 105.

The layout 100 includes a number of active contacts 129 for coupling electrical signals to the active regions 106, 108, 114, 122 and a number of poly or gate contacts 130 for coupling electrical signals to the gate regions (e.g., gate region 102, gate region 104, gate region 118, gate region 126). The layout 100 includes regions arranged along a third pitch 132 positioned adjacent to and extending in parallel with the first pitch 103 and regions arranged along a fourth pitch 134 positioned adjacent to and extending in parallel with the second pitch 105. A second memory cell 136 and a third memory cell 138 may be positioned respectively on an upper side and a lower side of the SRAM cell 101. Active regions of the SRAM cell 101 may extend into the second memory cell 136 and/or the third memory cell 138.

The SRAM cell 101 includes a plurality of read ports located on lateral sides of the 6T write port along a width direction of the SRAM cell 101. In particular, the SRAM cell 101 includes a fifth active region 140 extending transversely to an extension of the gate region 102. The fifth active region 140 is located laterally outward of the third active region 114 relative to the first active region 106. The SRAM cell 101 also includes a sixth active region 142 extending transversely to an extension of the gate region 104. The sixth active region 142 is located laterally outward of the fourth active region 122 relative to the second active region 108. The fifth active region 140 and the sixth active region 142 each extend continuously across the first pitch 103, the second pitch 105, the third pitch 132, and the fourth pitch 134.

The plurality of read ports of the SRAM cell 101 may include a read port 144 and a read port 146 formed at least in part along the fifth active region 140. A gate region of the second pitch 105 and/or a gate region of the fourth pitch 134 may overlay the fifth active region 140 to form one or more transistors of the read port 144. A gate region of the first pitch 103, such as the gate region 102, and/or a gate region of the third pitch 132 may overlay the fifth active region 140 to form one or more transistors of the read port 146.

The plurality of read ports of the SRAM cell 101 may also include a read port 148 and a read port 150 formed at least in part along the sixth active region 142. A gate region of the second pitch 105, such as the gate region 104, and/or a gate region of the fourth pitch 134 may overlay the sixth active region 142 to form one or more transistors of the read port 148. A gate region of the first pitch 103 and/or a gate region of the third pitch 132 may overlay the sixth active region 142 to form one or more transistors of the read port 150.

The read port 144, the read port 146, the read port 148, and/or the read port 150 may include one or more of the active contacts 129 coupled to active regions and/or one or more of the gate contacts 130 coupled to gate regions to apply electrical signals and control operation of the plurality of read ports.

The SRAM cell 101 has a width W1, which depends on the structure of the SRAM cell 101 shown in FIG. 1. An array of SRAM memory cells may be produced that each have the structure shown with respect to the SRAM cell 101.

Accordingly, an overall area occupied by the array of SRAM memory cells depends on the structure of the constituent memory cells.

Figure 2:
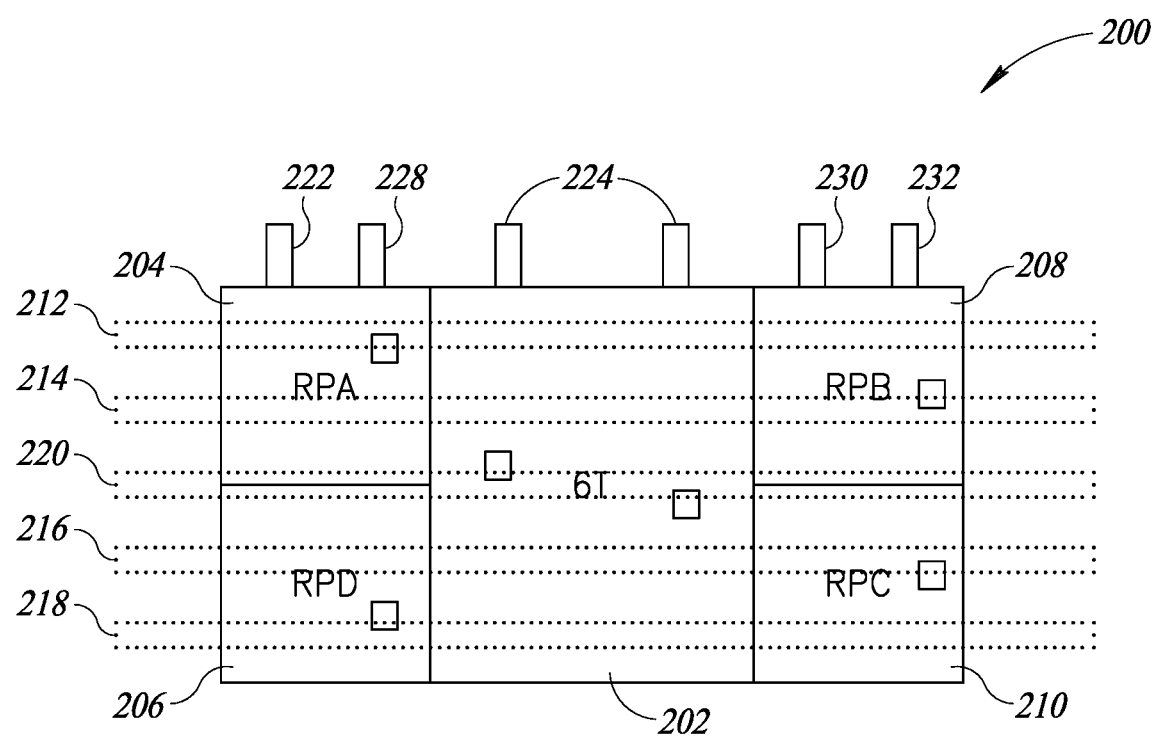
FIG. 2 is a diagram of a Static Random Access Memory (SRAM) cell according to one or more embodiments.

FIG. 2 shows an SRAM cell diagram 200 according to one or more embodiments. The diagram 200 has a quint port topology comprising a single write port 202 and four read ports designated as RPA, RPB, RPC, and RPD in the diagram 200. The write port 202 includes 6 transistors (6T) and is located between pairs of the four read ports. A first pair of read ports 204 and 206 are located on a first side of the write port 202 and a second pair of read ports 208 and 210 are located on a second side of the write port 202 opposite to the first side. A set of read word lines 212, 214, 216, and 218 are provided for controlling read operations from the read ports 204, 206, 208, and 210. A write word line 220 is provided for controlling write operations of the write port 202. Read bit lines 222, 228, 230, and 232 are connected to the read ports 204, 206, 208, and 210 respectively for reading data from the SRAM cell. A set of write bit lines 224 is connected to the write port 202 for writing data to the SRAM cell.

The SRAM cell in the diagram 200 has a four pitch structure in which the read ports 204, 206, 208, 210 and the write port 202 are formed across four pitches of gate regions. Internal connections may be provided in a first layer of the SRAM cell, such as a first layer of metal regions. The read bit lines 222, 228, 230, and 232 and the write bit lines 224 may be provided in a second layer of the SRAM cell, such as a second layer of metal regions. The read bit lines 222, 228, 230, and 232 provide a signal for selectively enabling a read operation of a bit of data stored in the SRAM cell. The set of write bit lines 224 provide a signal for selectively enabling a write operation for storing the bit of data in the SRAM cell. Power and ground lines may also be provided in the second layer. Read and write word lines 212, 214, 216, 218, and 220 may be provided in a third layer of the SRAM cell, such as a third layer of metal regions. It is noted that the diagram 200 is a non-limiting representation of a general layout of an SRAM cell, which may include a greater number of lines than those depicted and described with respect to FIG. 2.

Figure 3:
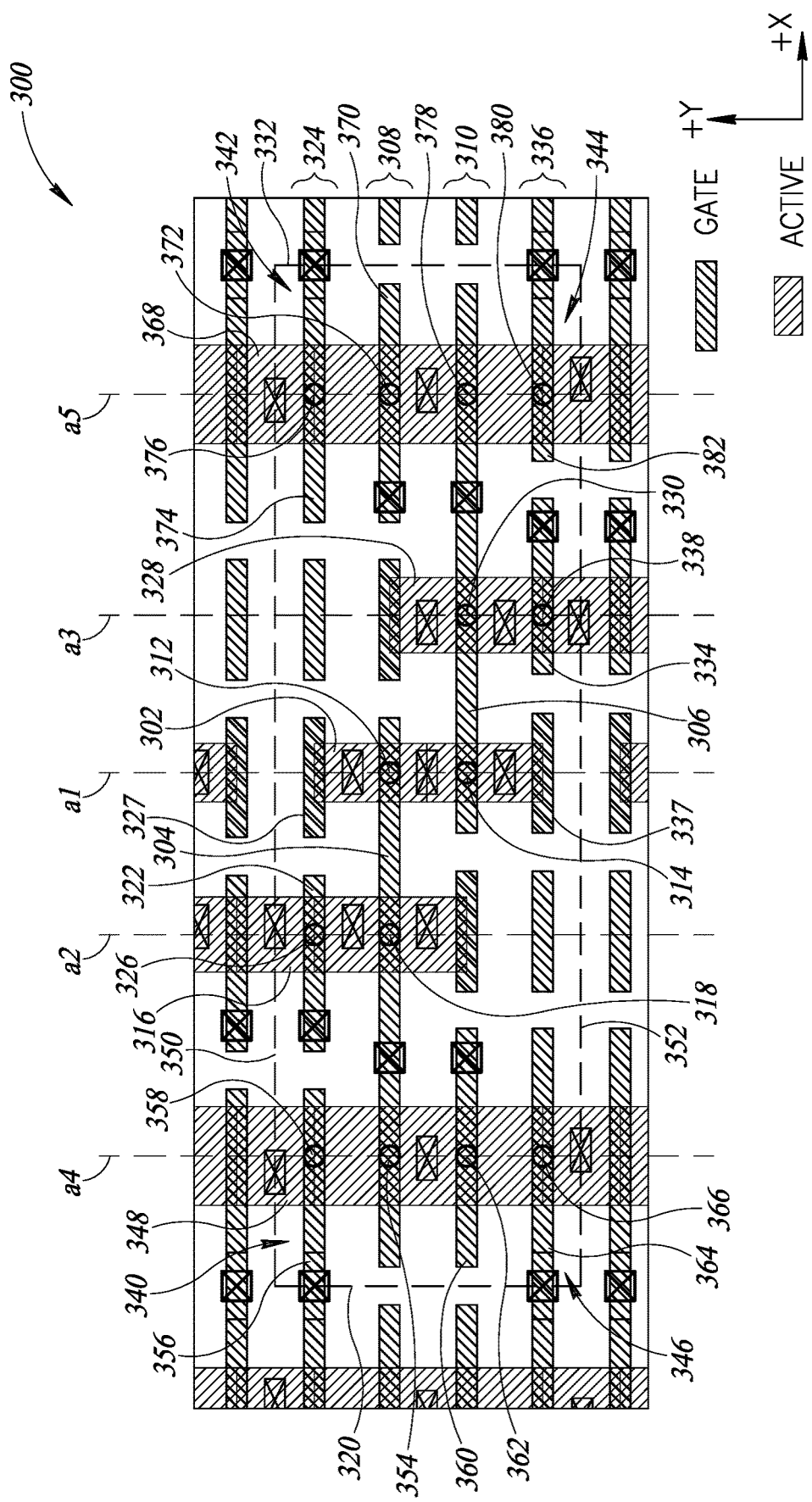
FIG. 3 is a first layout diagram of a first SRAM cell according to one or more embodiments.

FIG. 3 shows a layout of an SRAM cell 300 according to one or more embodiments. The SRAM cell 300 includes active regions disposed on an active region layer, and gate regions disposed on a gate region layer that is different than the active region layer. The SRAM cell 300 includes other layers and interconnections between layers, some of which may be omitted from the present disclosure for clarity and some of which layers are discussed elsewhere herein. For instance, the SRAM cell 300 may include word lines, bit lines, power lines, ground lines, etc., for supplying signals to and between various portions of an SRAM component. The SRAM cell 300 includes edges 320, 332, 350, 352. Outside of these edges are adjacent cells of an array of SRAM cells.

The SRAM cell 300 includes a first active region 302 that is formed on a semiconductor substrate, such as silicon or other suitable material. The first active region 302 has an elongated shape extending in a direction along a first axis a1 (e.g., in a direction parallel with the y-axis shown). The SRAM cell 300 includes a first gate region 304 having an elongated shape extending in a direction transverse to the first axis a1 (e.g., in a direction parallel to the x-axis shown) and a second gate region 306 extending in a direction transverse to the first axis a1. The first gate region 304 is located along a first pitch 308 of a set of gate regions of the SRAM cell 300 and the second gate region 306 is located along a second pitch 310 of a set of gate regions of the SRAM cell 300. The first pitch 308 and the second pitch 310 extend in directions parallel to the x-axis shown. The gate regions of the first pitch 308 are spaced apart from the gate regions of the second pitch 310 in a direction transverse to the first axis a1.

The first active region 302 overlays the first gate region 304 to form a first transistor 312 and the first active region 302 overlays the second gate region 306 to form a second transistor 314. The first and second gate regions can form source and drain regions of the respective transistors. For example, these may be doped regions formed in a wafer before the gate regions are formed. The first gate region 304 and the second gate region 306 are separated and spaced apart from each other in a direction along the first axis a1—that is, spaced apart from each other along a dimension of the first active region 302 that is along the first axis a1. The first transistor 312 is located along the first pitch 308 and the second transistor 314 is located along the second pitch 310 of the SRAM cell 300. The first transistor 312 and the second transistor 314 are relatively positioned along a direction parallel to the first axis a1.

The SRAM cell 300 also includes a second active region 316 having an elongated shape extending in a direction along a second axis a2 (e.g., in a direction parallel with the y-axis). The second active region 316 is spaced apart from the first active region 302 in a substantially lateral direction transverse to the first axis a1. The second active region 316 overlays with the first gate region 304 to form a third transistor 318 that is located along the first pitch 308 of the SRAM cell 300. The third transistor 318 is also located along the second axis a2 between the first axis a1 and a first side edge 320 of the SRAM cell 300.

The SRAM cell 300 also includes a third gate region 322 having an elongated shape that extends in a direction transverse to the second axis a2. The third gate region 322 is located along a third pitch 324 of a set of gate regions of the SRAM cell 300. The third pitch 324 extends in a direction parallel with the first pitch 308 and/or the second pitch 310. The third pitch 324 is spaced apart from the first pitch 308 in a direction along the first axis a1 (e.g., in a +y direction in parallel with the y-axis). The third gate region 322 overlays the second active region 316 to form a fourth transistor 326 that is located along the third pitch 324. The fourth transistor 326 is located along the second axis a2 between the first axis a1 and the first side edge 320 of the SRAM cell 300. The SRAM cell 300 may include a gate region 327 located along the third pitch 324 at a first end of the first active region 302.

The SRAM cell 300 includes a third active region 328 having an elongated shape extending in a direction along a third axis a3 (e.g., in a direction parallel with the y-axis). The third active region 328 is spaced apart from the first active region 302 in a substantially lateral direction transverse to the first axis a1. The third active region 328 overlays with the second gate region 306 to form a fifth transistor 330 that is located along the second pitch 310 of the SRAM cell 300. The fifth transistor 330 is also located along the third axis a3 and a second side edge 332 of the SRAM cell 300.

The SRAM cell 300 further includes a fourth gate region 334 having an elongated shape that extends in a direction transverse to the third axis a3. The fourth gate region 334 is located along a fourth pitch 336 of a set of gate regions of the SRAM cell 300. The fourth pitch 336 extends in a direction parallel with the first pitch 308 and/or the second pitch 310. The fourth pitch 336 is spaced apart from the second pitch 310 in a direction along the first axis a1 (e.g., in a direction parallel with the y-axis). The fourth gate region 334 overlays the third active region 328 to form a sixth transistor 338 that is located along the fourth pitch 336. The sixth transistor 338 is located along the third axis a3 between the first axis a1 and the second side edge 332 of the SRAM cell 300. The SRAM cell 300 may include a gate region 337 located along the fourth pitch 336 at a second end of the first active region 302 opposite to the first end.

The first active region 302 extends between the four pitches. In particular, the first active region 302 extends between the third pitch 324 and the first pitch 308. The first active region 302 may partially overlay with the third pitch 324 although the first active region 302 may not overlay a gate region in the third pitch 324 to form a transistor. The first active region 302 also extends between the fourth pitch 336 and the second pitch 310. The first active region 302 may partially overlay with the fourth pitch 336 although the first active region 302 may not overlay a gate region in the fourth pitch 336 to form a transistor. The first active region 302 also extends between the first pitch 308 and the second pitch 310.

The fourth transistor 326 and the sixth transistor 338 comprise, in part, a write port of the SRAM cell 300. The first transistor 312, the second transistor 314, the third transistor 318, and the fifth transistor 330 form a pair of cross-coupled inverters that store a data state of the SRAM cell 300. The pair of cross-coupled inverters and the write port are located in a center portion between active regions that comprise the read ports of the SRAM cell 300 (e.g., read ports 204, 206, 208, and 210), as described herein. As a non-limiting embodiment of a complementary metal-oxide semiconductor (CMOS) configuration of the SRAM cell 300, the first transistor 312 and the second transistor 314 may be pull-up transistors (i.e., PMOS transistors), the third transistor 318 and the fifth transistor 330 may be pull-down transistors (i.e., NMOS transistors), and the fourth transistor 326 and the sixth transistor 338 may be pass gate transistors (e.g., NMOS transistors). However, this relative configuration of transistor types may be adjusted based on signal connections to the SRAM cell 101.

The SRAM cell 300 comprises a set of read ports for reading electrical characteristics representative of stored bits in the SRAM cell 300. In particular, the SRAM cell 300 includes a first read port 340, a second read port 342, a third read port 344, and a fourth read port 346. Schematic layout and operation of the read ports are described elsewhere herein. The first read port 340 may include a seventh transistor 354 of the SRAM cell 300 in some embodiments. The first read port 340 is located outwardly of the center portion between the second active region 316 and the first side edge 320. A fourth active region 348 extends between an upper edge 350 of the SRAM cell 300 and a lower edge 352 of the SRAM cell 300 and along a fourth axis a4. The fourth active region 348 is spaced apart from the second active region 316 toward the first side edge 320. The fourth active region 348 overlays the first gate region 304 to form the seventh transistor 354, which is located along the first pitch 308 of the SRAM cell 300 and is also located along the fourth axis a4.

The SRAM cell 300 includes a fifth gate region 356 having an elongated shape that extends in a direction transverse to the fourth axis a4. The fifth gate region 356 is located along the third pitch 324 of the set of gate regions of the SRAM cell 300. The fifth gate region 356 overlays the fourth active region 348 to form an eighth transistor 358 that is located along the third pitch 324. The eighth transistor 358 is located along the fourth axis a4 between the seventh transistor 354 and the upper edge 350. The eighth transistor 358 is considered as being part of the first read port 340.

The fourth read port 346 is located outwardly of the center portion between the second active region 316 and the first side edge 320, and is located adjacent to the first read port 340 along the fourth axis a4. The SRAM cell 300 may include a sixth gate region 360 located along the second pitch 310 of the set of gate regions of the SRAM cell 300. The sixth gate region 360 has an elongated shape that extends in a direction transverse to the fourth axis a4. The fourth active region 348 overlays the sixth gate region 360 to form a ninth transistor 362, which is part of the fourth read port 346. The ninth transistor 362 is located along the second pitch 310 of the SRAM cell 300 and is located along the fourth axis a4.

The SRAM cell 300 may further include a seventh gate region 364 located along the third pitch 336 of the set of gate regions of the SRAM cell 300. The seventh gate region 364 has an elongated shape that extends in a direction transverse to the fourth axis a4. The fourth active region 348 overlays the seventh gate region 364 to form a tenth transistor 366, which is part of the fourth read port 346. The tenth transistor 366 is located along the third pitch 336 of the SRAM cell 300 and is located along the fourth axis a4.

The second read port 342 comprising one or more transistors is located outwardly of the write port between the third active region 328 and the second side edge 332. The SRAM cell 300 may include a fifth active region 368 that extends between the upper edge 350 and the lower edge 352 of the SRAM cell 300 and along a fifth axis a5. The fifth active region 368 is spaced apart from the third active region 328 toward the second side edge 332. The second read port 342 may include an eighth gate region 370 having an elongated shape that extends in a direction transverse to the fifth axis a5. The eighth gate region 370 is located along the first pitch 308 of the SRAM cell 300. The fifth active region 368 overlays the eighth gate region 370 to form an eleventh transistor 372 that is located along the first pitch 308 of the SRAM cell 300. The eleventh transistor 372 is also located along the fifth axis a5 and is considered as being part of the second read port 342.

The second read port 342 of the SRAM cell 300 may include a twelfth transistor 376 of the SRAM cell 300 in some embodiments. The second read port 342 may include a ninth gate region 374 having an elongated shape that extends in a direction transverse to the fifth axis a5. The ninth gate region 374 is located along the third pitch 324 of the SRAM cell 300. The fifth active region 368 overlays the ninth gate region 374 to form the twelfth transistor 376, which is located along the third pitch 324 of the SRAM cell 300.

The third read port 344 comprising one or more transistors is located outwardly of the center portion of the SRAM cell 300 between the third active region 328 and the second side edge 332. The third read port 344 may include a thirteenth transistor 378 of the SRAM cell 300. The fifth active region 368 may overlay the second gate region 306 along the fifth axis a5 to form the thirteenth transistor 378, which is located along the second pitch 310 of the SRAM cell 300.

The third read port 344 may include a fourteenth transistor 380 of the SRAM cell 300 in some embodiments. The third read port 344 may include a tenth gate region 382 having an elongated shape that extends in a direction transverse to the fifth axis a5. The tenth gate region 382 is located along the fourth pitch 336 of the SRAM cell 300. The fifth active region 368 overlays the tenth gate region 382 to form the fourteenth transistor 380, which is located along the fourth pitch 336 of the SRAM cell 300.

Figure 4:
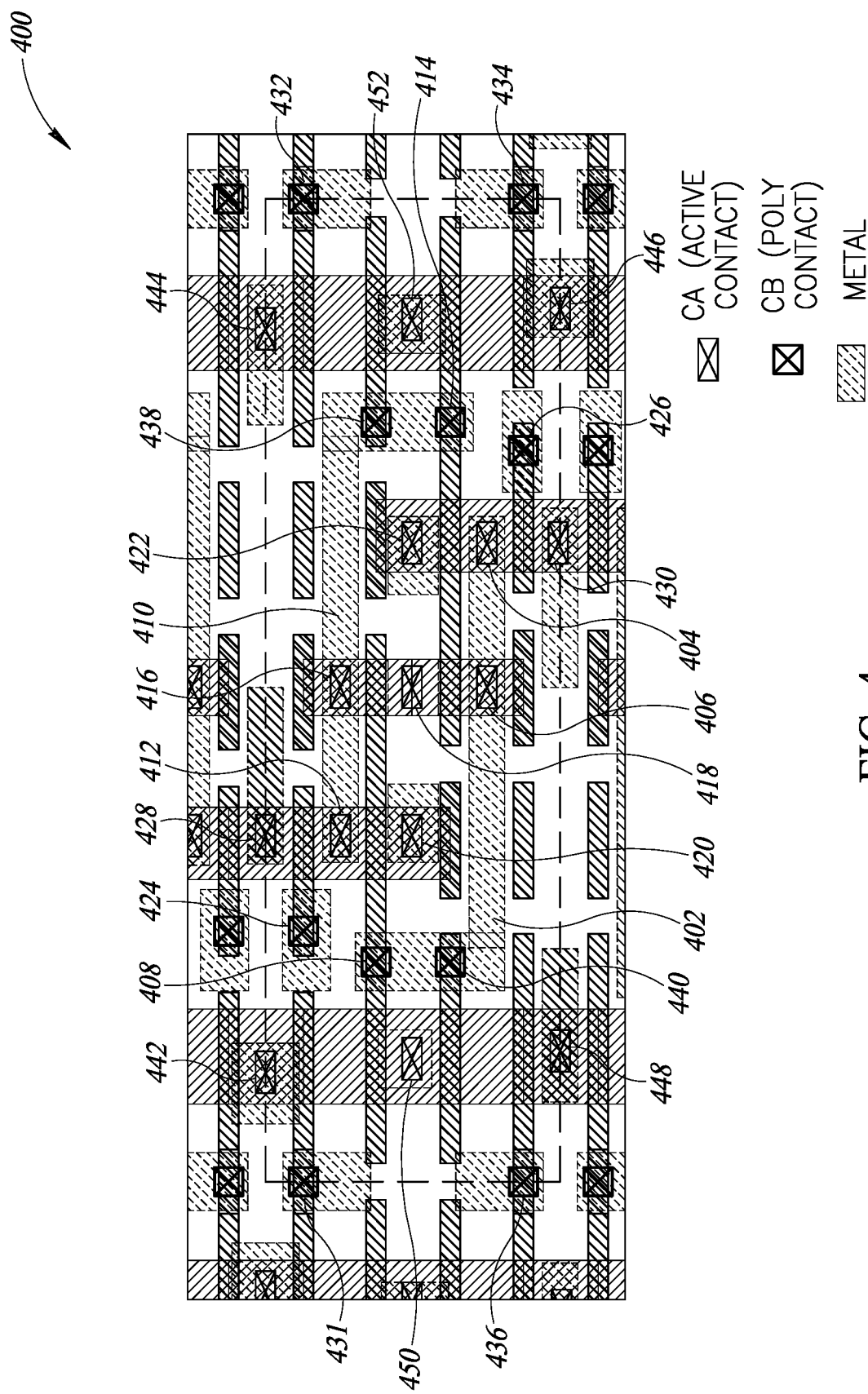
FIG. 4 is a second layout diagram of the first SRAM cell of FIG. 3.

FIG. 4 shows a layout 400 of the SRAM cell 300 that includes additional regions and shows connections between different regions thereof according to one or more embodiments. In particular, the layout 400 includes regions other than the active regions and gate regions discussed with respect to FIG. 3 and includes interconnections between different regions. The layout 400 of the SRAM cell 300 includes a set of metal regions disposed in a layer separate than the active region layer and the gate region layer.

A first metal region 402 is connected to the third active region 328 via a first active contact 404. The first metal region 402 is connected to the first gate region 304 via a first gate contact 408. The first metal region 402 connects the third active region 328 to the first active region 302 via a second active contact 406. A second metal region 410 is connected to the second active region 316 via a third active contact 412. The second metal region 410 is connected to the second gate region 306 via a second gate contact 414 and is connected to the first active region 302 via a fourth active contact 416. The first metal region 402 and the second metal region 410 may be considered as having an L-shape; however, in some embodiments, the first metal region 402 and the second metal region 410 may each be comprised of a plurality of segments that form the L-shape. The first metal region 402 and the second metal region 410 cross couple a pair of inverters formed by the first transistor 312, the second transistor 314, the third transistor 318, and the fifth transistor 330, as discussed elsewhere herein.

Signals may be provided to the transistors of the SRAM cell 300 through various contacts coupled to the regions. A fifth active contact 418 is coupled to the first active region 302 between the first pitch 308 and the second pitch 310. A line providing a power signal or a ground may be coupled to the first active region 302 via the fifth active contact 418. A sixth active contact 420 is coupled to the second active region 316 and a seventh active contact 422 is coupled to the third active region 328 between the first pitch 308 and the second pitch 310. Lines providing a power signal or a ground may be coupled to the second active region 316 and the third active region 328 via the sixth active contact 420 and the seventh active contact 422. For instance, a power line providing a power signal (e.g., +5 VDC) may be provided to the SRAM cell 300 via the fifth active contact 418 and ground lines providing a ground reference (e.g., 0 VDC reference) may be coupled to the sixth active contact 420 and the seventh active contact 422. This configuration may be modified based on the desired operation of the SRAM cell 300.

Contacts of the SRAM cell 300 may be coupled to various lines thereof to operably store electrical signals representing data bits in the SRAM cell 300. In some embodiments, a third gate contact 424 is coupled to the third gate region 322 along the third pitch 324 and a fourth gate contact 426 is coupled to the fourth gate region 334 along the fourth pitch 336. Lines may be coupled to the third gate contact 424 and the fourth gate contact 426 to provide a signal that controls operation of a gate of the fourth transistor 326 and operation of a gate of the sixth transistor 338. For instance, write word lines (WWLs) for selectively enabling data to be written to the SRAM cell 300 may be coupled to the third gate contact 424 and the fourth gate contact 426. A ninth active contact 428 is coupled to the second active region 316 above the third pitch 324 and a tenth active contact 430 is coupled to the third active region 328 below the fourth pitch 336. Lines may be coupled to the ninth active contact 428 and the tenth active contact 430 for providing a signal corresponding to data to be written to the SRAM cell 300. For example, bit lines (BLs) for providing data to be written to the SRAM cell 300 may be coupled to the ninth active contact 428 and the tenth active contact 430.

Data may be read from the SRAM cell 300 via one or more of the read ports. Lines are provided in the SRAM cell 300 and connected to the read ports for enabling read operations from individual read ports. A ninth gate contact 431 is coupled to the fifth gate region 356 (e.g., along the third pitch 324) for enabling performance of a read operation from the first read port 340. A tenth gate contact 432 is coupled to the ninth gate region 374 (e.g., along the third pitch 324) for enabling performance of a read operation from the second read port 342. An eleventh gate contact 434 is coupled to the tenth gate region 382 (e.g., along the fourth pitch 336) for enabling performance of a read operation from the third read port 344. A twelfth gate contact 436 is coupled to the seventh gate region 364 (e.g., along the fourth pitch 336) for enabling performance of a read operation from the fourth read port 346.

A thirteenth gate contact 438 electrically couples the eighth gate region 370 to the second metal region 410, thereby connecting the cross-coupled inverters of the SRAM cell 300 to the second read port 342. The thirteenth gate contact 438 may be located along the first pitch 308. A fourteenth gate contact 440 electrically couples the sixth gate region 360 to the first metal region 402, thereby connecting the cross-coupled inverters of the SRAM cell 300 to the fourth read port 346. The fourteenth gate contact 440 may be located along the second pitch 310. Read word lines (not shown) may be coupled to the ninth gate contact 431, the tenth gate contact 432, the eleventh gate contact 434, and the twelfth gate contact 436 for respectively performing read operations of the first read port 340, the second read port 342, the third read port 344, and the fourth read port 346.

Lines are also connected to the read ports for reading data stored in the SRAM cell 300. An eleventh active contact 442 is coupled to the fourth active region 348 for reading data stored in the SRAM cell 300 from the first read port 340. An twelfth active contact 444 is coupled to the fifth active region 368 for reading data stored in the SRAM cell 300 from the second read port 342. The eleventh active contact 442 and the twelfth active contact 444 are located above the third pitch 324 toward the upper edge 350. A thirteenth active contact 446 is coupled to the fifth active region 368 for reading data stored in the SRAM cell 300 from the third read port 344. A fourteenth active contact 448 is coupled to the fourth active region 348 for reading data stored in the SRAM cell 300 from the fourth read port 346. The thirteenth active contact 446 and the fourteenth active contact 448 are located below the fourth pitch 336 toward the lower edge 352. Read bit lines (not shown) may be coupled to the eleventh active contact 442, the twelfth active contact 444, the thirteenth active contact 446, and the fourteenth active contact 448 for reading a state of the SRAM cell 300.

The SRAM cell 300 may include a fifteenth active contact 450 coupled to the fourth active region 348 and a sixteenth active contact 452 coupled to the fifth active region 368. The fifteenth active contact 450 and the sixteenth active contact 452 may be provided for coupling a power line or a ground line to the read ports. For instance, ground lines providing a ground reference (0 VDC) may be coupled to the fifteenth active contact 450 and the sixteenth active contact 452.

The configuration and layout of the SRAM cell 300 provides numerous advantages over other SRAM designs.

For instance, the six transistor area comprising the center portion of the SRAM cell 300 has a short width (i.e., in a direction along the x-axis) relative to the width of the SRAM cell 101 discussed with respect to FIG. 1. This design can achieve a reduction in area of 26.3% in comparison to previously-implemented designs. The SRAM cell 300 may, for instance, occupy an area smaller than the area of the SRAM cell 101. This is because the first transistor 312 and the second transistor 314 are stacked over each other in the same active region, the first active region 302, instead of being formed on separate laterally spaced apart active regions like the first transistor 110 and the second transistor 112.

Figure 5:
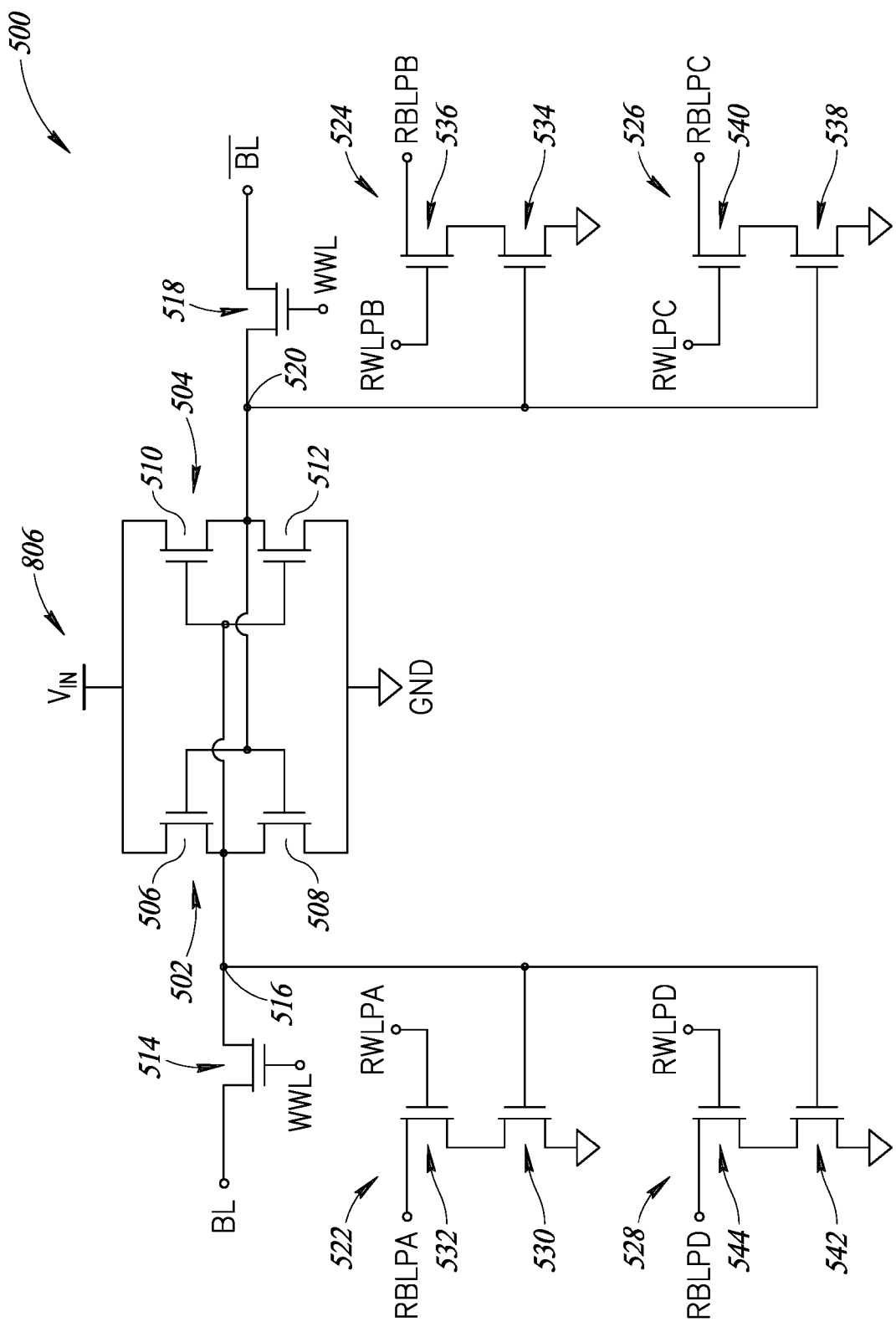
FIG. 5 is a schematic circuit diagram of the first SRAM cell of FIG. 3.

FIG. 5 shows a schematic diagram of a circuit 500 corresponding to the SRAM cell 300 and the layout 400 described above with respect to FIGS. 3 and 4. The circuit 500 includes a pair of cross-coupled inverters comprising a first inverter 502 and a second inverter 504. The first inverter 502 includes a first transistor 506 and a second transistor 508 in series with the first transistor 506. The second inverter 504 includes a third transistor 510 and a fourth transistor 512 in series with the third transistor 510. In some embodiments, the first transistor 506 and the third transistor 510 are pull-up transistors whereas the second transistor 508 and the fourth transistor 512 are pull-down transistors. However, the types of transistors may be adjusted depending on the desired configuration of the circuit 500. With reference to FIG. 3, the first transistor 506 may correspond to the first transistor 312, the second transistor 508 may correspond to the third transistor 318, the third transistor 510 may correspond to the second transistor 314, and the fourth transistor 512 may correspond to the fifth transistor 330. The pair of cross-coupled inverters 502 and 504 collectively form a storage element for storing a data bit of the SRAM cell 300.

The circuit 500 includes a fifth transistor 514 coupled to the first inverter 502 and having a first terminal (e.g., one terminal of a source terminal and a drain terminal) coupled to a node 516 at which terminals of the first transistor 506 and the second transistor 508 are commonly connected. A gate terminal of the fifth transistor 514 is coupled to a line for controlling a write operation for the SRAM cell 300, such as a WWL. A second terminal of the fifth transistor 514 (e.g., other terminal of the source terminal and the drain terminal) is coupled to a line for providing a bit to be written to the SRAM cell 300 during a write operation, such as a write bit line. The fifth transistor 514 may correspond to the fourth transistor 326 described with respect to FIG. 3. The fifth transistor 514 is a pass gate transistor in at least some embodiments.

The circuit 500 also includes a sixth transistor 518 connected to the second inverter 504 and having a first terminal (e.g., one terminal of a source terminal and drain terminal) coupled to a node 520 at which terminals of the third transistor 510 and the fourth transistor 512 are commonly connected. A gate terminal of the sixth transistor 518 is coupled to a line for controlling a write operation for the SRAM cell 300, such as a WWL. A second terminal of the sixth transistor 518 (e.g., other terminal of the source terminal and the drain terminal) is coupled to a line for providing a bit to be written to the SRAM cell 300 during a write operation, such as a write bit line. The sixth transistor 518 may correspond to the sixth transistor 338 described with respect to FIG. 3. The sixth transistor 518 is a pass gate transistor in at least some embodiments.

The circuit 500 additionally includes a set of read ports for reading stored bit values from the SRAM cell 300. The set of read ports include one or more ports selected from a first read port 522, a second read port 524, a third read port 526, and a fourth read port 528. The set of read ports have substantially similar layouts to each other. Having a plurality of read ports may provide numerous advantages to an SRAM circuit, such as enabling performance of numerous read operations in a single cycle without the need to perform a pre-charge operation for each read. In some embodiments, the circuit 500 may include fewer read ports than four, such as a pair of read ports each coupled to read from one of the first inverter 502 and the second inverter 504.

The first read port 522 includes a seventh transistor 530 and an eighth transistor 532 coupled in series with the seventh transistor 530. A gate terminal of the seventh transistor 530 is coupled to the node 516 for reading a bit value from the first inverter 502 during a read operation. A gate terminal of the eighth transistor 532 is coupled to a line for selectively enabling the first read port 522 to perform a read operation, such as a read word line coupled to the ninth gate contact 431. A first terminal of the eighth transistor 532 is coupled to a line for outputting a bit read from the first inverter 502 during a read operation (e.g., at the eleventh active contact 442 of FIG. 4). A second terminal of the eighth transistor 532 is coupled to a first terminal of the seventh transistor 530 and a second terminal of the seventh transistor 530 is coupled to a line providing a ground reference (e.g., at the fifteenth active contact 450). With reference to FIG. 3, the seventh transistor 530 corresponds to the seventh transistor 354 and the eighth transistor 532 corresponds to the eighth transistor 358.

The second read port 524 includes a ninth transistor 534 and a tenth transistor 536 coupled in series with the ninth transistor 534. A gate terminal of the ninth transistor 534 is coupled to the node 520 for reading a bit value from the second inverter 504 during a read operation. A gate terminal of the tenth transistor 536 is coupled to a line for selectively enabling the second read port 524 to perform a read operation, such as a read word line coupled to the tenth gate contact 432. A first terminal of the tenth transistor 536 is coupled to a line for outputting a bit read from the second inverter 504 during a read operation (e.g., at the twelfth active contact 444 of FIG. 4). A second terminal of the tenth transistor 536 is coupled to a first terminal of the ninth transistor 534 and a second terminal of the ninth transistor 534 is coupled to a line providing a ground reference (e.g., at the sixteenth active contact 452 of FIG. 4). With reference to FIG. 3, the ninth transistor 534 corresponds to the eleventh transistor 372 and the tenth transistor 536 corresponds to the twelfth transistor 376.

The third read port 526 includes an eleventh transistor 538 and a twelfth transistor 540 coupled in series with the eleventh transistor 538. A gate terminal of the eleventh transistor 538 is coupled to the node 520 for reading a bit value from the second inverter 504 during a read operation. A gate terminal of the twelfth transistor 540 is coupled to a line for selectively enabling the third read port 526 to perform a read operation, such as a read word line coupled to the eleventh gate contact 434. A first terminal of the twelfth transistor 540 is coupled to a line for outputting a bit read from the second inverter 504 during a read operation (e.g., at the thirteenth active contact 446 of FIG. 4). A second terminal of the twelfth transistor 540 is coupled to a first terminal of the eleventh transistor 538 and a second terminal of the eleventh transistor 538 is coupled to a line providing a ground reference (e.g., at the sixteenth active contact 452 of FIG. 4). With reference to FIG. 3, the eleventh transistor 538 corresponds to the thirteenth transistor 378 and the twelfth transistor 540 corresponds to the fourteenth transistor 380.

The fourth read port 528 includes a thirteenth transistor 542 and a fourteenth transistor 544 coupled in series with the thirteenth transistor 542. A gate terminal of the thirteenth transistor 542 is coupled to the node 516 for reading a bit value from the first inverter 502 during a read operation. A gate terminal of the fourteenth transistor 544 is coupled to a line for selectively enabling the fourth read port 528 to perform a read operation, such as a read word line coupled to the twelfth gate contact 436. A first terminal of the fourteenth transistor 544 is coupled to a line for outputting a bit read from the first inverter 502 during a read operation (e.g., at the fourteenth active contact 448 of FIG. 4). A second terminal of the fourteenth transistor 544 is coupled to a first terminal of the thirteenth transistor 542 and a second terminal of the thirteenth transistor 542 is coupled to a line providing a ground reference (e.g., at the fifteenth active contact 450 of FIG. 4). With reference to FIG. 3, the thirteenth transistor 542 corresponds to the ninth transistor 362 and the fourteenth transistor 544 corresponds to the tenth transistor 366.

A read operation may include causing performance of read operations via two read ports. For instance, a read operation may include causing the first read port 522 to read a state of the first inverter 502 via the node 516 and causing the second read port 524 to read a state of the second inverter 504 via the node 520. The read operation may exclude performance from the other two read ports, the third read port 526 and the fourth read port 528. A subsequent read operation may include causing (e.g., by a controller not shown) the third read port 526 to read a state of the second inverter 504 via the node 520 and the fourth read port 528 to read a state of the first inverter 502 via the node 516.

Figure 6:
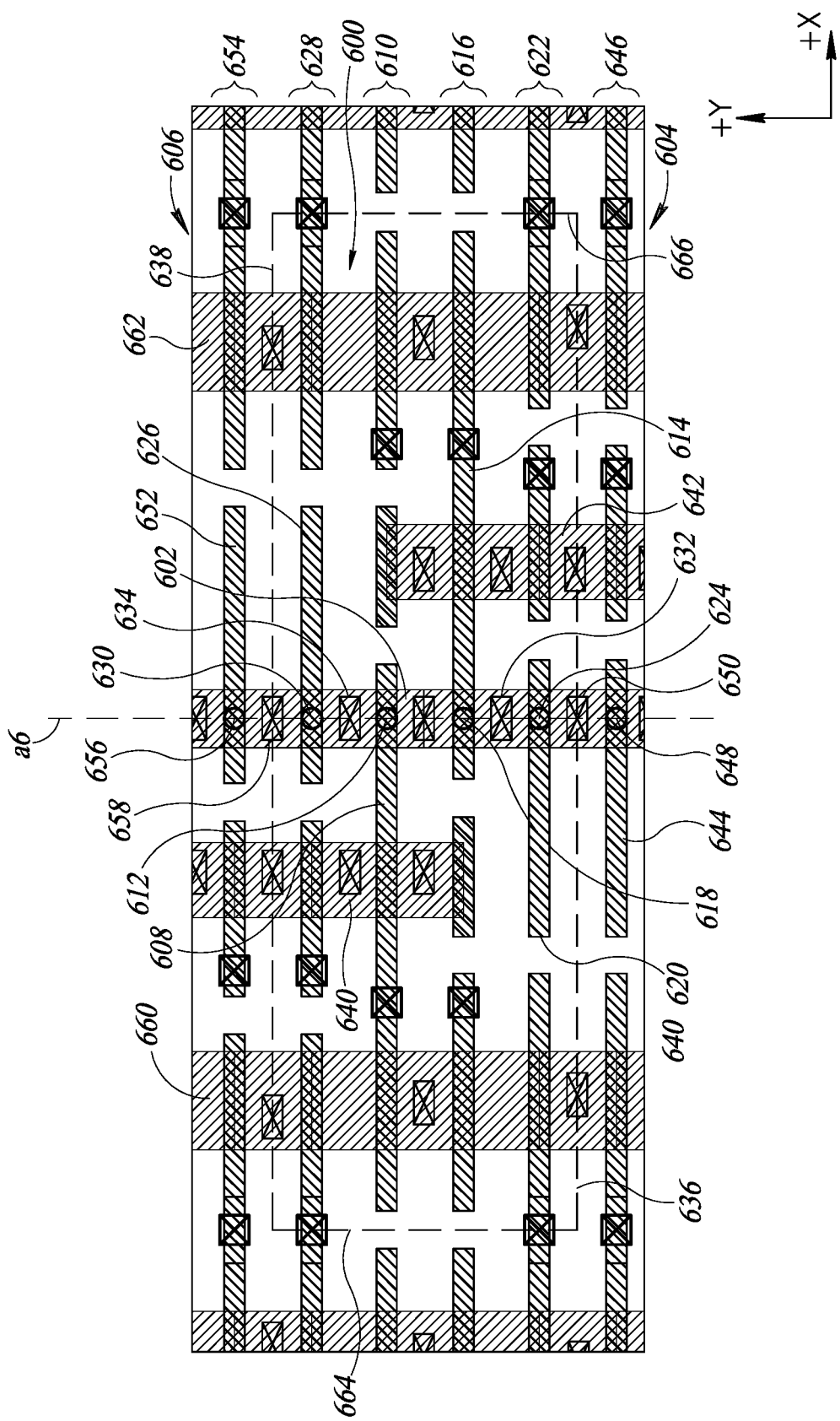
FIG. 6 is a first layout of a second SRAM cell according to one or more embodiments.

As a result of the present SRAM cell structure, a central active region can be extended into adjacent SRAM cells. FIG. 6 shows an SRAM cell 600 according to one or more embodiments. The SRAM cell 600 includes a first active region 602 extending along an axis a6 that is parallel to the y-axis. The first active region 602 extends along the axis a6 from the SRAM cell 600 to a second SRAM cell 604 adjacent to the SRAM cell 600 in a first direction (i.e., in a −y direction in parallel with the y-axis). The first active region 602 also extends along the axis a6 from the SRAM cell 600 to a third SRAM cell 606 adjacent to the SRAM cell 600 in a second direction opposite to the first direction (i.e., in a +y direction in parallel with the y-axis).

The SRAM cell 600 includes a first gate region 608 that extends along a first pitch 610 in a direction transverse to the axis a6. The first gate region 608 overlays the first active region 602 to form a first transistor 612 located along the axis a6. The first transistor 612 corresponds to the first transistor 312 described with respect to FIG. 3. The SRAM cell 600 also includes a second gate region 614 that extends along a second pitch 616 in a direction transverse to the axis a6. The second gate region 614 overlays with the first active region 602 to form a second transistor 618 located along the first axis a6. The second transistor 618 corresponds to the second transistor 314 described with respect to FIG. 3.

The SRAM cell 600 includes a third gate region 620 that extends along a third pitch 622 in a direction transverse to the axis a6. The third gate region 620 is located between the second pitch 616 and the second SRAM cell 604 in a direction along the axis a6. The third gate region 620 overlays the first active region 602 to form a third transistor 624 located along the axis a6. The SRAM cell 600 includes a fourth gate region 626 that extends along a fourth pitch 628 in a direction transverse to the axis a6. The fourth gate region 626 is located between the first pitch 610 and the third SRAM cell 606 in a direction along the axis a6. The fourth gate region 626 overlays the first active region 602 to form a fourth transistor 630 located along the axis a6.

A first active contact 632 may be coupled to the first active region 602 at a location between the second gate region 614 and the third gate region 620. A second active contact 634 may be coupled to the first active region 602 in a location between the first gate region 608 and the fourth gate region 626. One or more lines may be connected to the first active contact 632 and the second active contact 634 to provide a signal or a ground reference to a portion of the first active region 602. For instance, lines providing a ground reference (e.g., VDC) may be connected to the first active contact 632 and the second active contact 634.

Extending the first active region 602 through a plurality of SRAM cells located along the axis a6 provides an improved source of shallow trench isolation. In particular, trenches extending on sides of the first active region 602 provide a continuous source of shallow trench isolation along the entire length of an SRAM cell array. Shallow trench isolation prevents or reduces electric current leakage between portions of the SRAM cells on a first side of the axis a6 and portions of the SRAM cells on a second side opposite to the first side about the axis a6. In other words, the continuous length of the first active region 602 the SRAM cell 600 facilitates prevention or reduction of electric current leakage between left and right sides of the SRAM cells. The SRAM cell architecture disclosed herein may also be associated with improvements in performance characteristics, such as power efficiency and write speed for writing data to the SRAM cell.

Each of the adjacent SRAM cells is substantially identical to the SRAM cell 600. The second SRAM cell 604 is a mirror image of the SRAM cell 600 reflected about a lower side 636 of the SRAM cell 600 and the third SRAM cell 606 is a mirror image of the SRAM cell 600 reflected about an upper side 638 of the SRAM cell 600. Specifically, an active region 640, which corresponds to the second active region 316 of FIG. 3, extends from the SRAM cell 600 and into the third SRAM cell 606 through the upper side 638. An active region 642, which corresponds to the third active region 328 of FIG. 3, extends from the SRAM cell 600 and into the second SRAM cell 604 through the lower side 636. A fourth SRAM cell (not pictured) located below the second SRAM cell 604 may be a mirror image of the second SRAM cell 604 about its lower side. A fifth SRAM cell (not pictured) located above the third SRAM cell 606 may be a mirror image of the third SRAM cell 606 about its upper side. This pattern may repeat along the length of the axis a6 to the edges of the SRAM cell array.

The second SRAM cell 604 may include a gate region 644 that extends along a pitch 646 in a direction transverse to the axis a6, the pitch 646 being an adjacent pitch to the third pitch 622. The gate region 644 overlays the first active region 602 to form a transistor 648 of the second SRAM cell 604. A third active contact 650 is coupled to the first active region 602 between the third gate region 620 of the SRAM cell 600 and the gate region 644 of the second SRAM cell 604. A line may be connected to the third active contact 650 to provide a signal to a portion of the first active region 602. As an example, a line providing a power signal (e.g., +5 VDC) may be connected to the third active contact 650.

The third SRAM cell 606 may include a gate region 652 that extends along a pitch 654 in a direction transverse to the axis a6, the pitch 654 being an adjacent pitch to the fourth pitch 628. The gate region 652 overlays the first active region 602 to form a transistor 656 of the third SRAM cell 606. A fourth active contact 658 is coupled to the first active region 602 between the fourth gate region 626 of the SRAM cell 600 and the gate region 652 of the third SRAM cell 606. A line may be connected to the fourth active contact 658 to provide a signal to a portion of the first active region 602. As an example, a line providing a power signal (e.g., +5 VDC) may be connected to the fourth active contact 658.

The SRAM cell 600 may include a fourth active region 660 extending in parallel with the axis a6 and located laterally outward of the active region 640. The SRAM cell 600 may include a fifth active region 662 extending in parallel with the axis a6 and located laterally outward of the active region 642. The fourth active region 660 and/or the fifth active region 662 may overlay with gate regions along the first pitch 610, the second pitch 616, the third pitch 622, and/or the fourth pitch 628 to form transistors of one or more read ports, as described with respect to FIGS. 3 and 4 and elsewhere herein. The fourth active region 660 may be spaced apart from the active region 640 toward a first side 664 of the SRAM cell 600. The fifth active region 662 may be spaced apart from the active region 642 toward a second side 666 of the SRAM cell 600 opposite to the first side 664.

Figure 7:
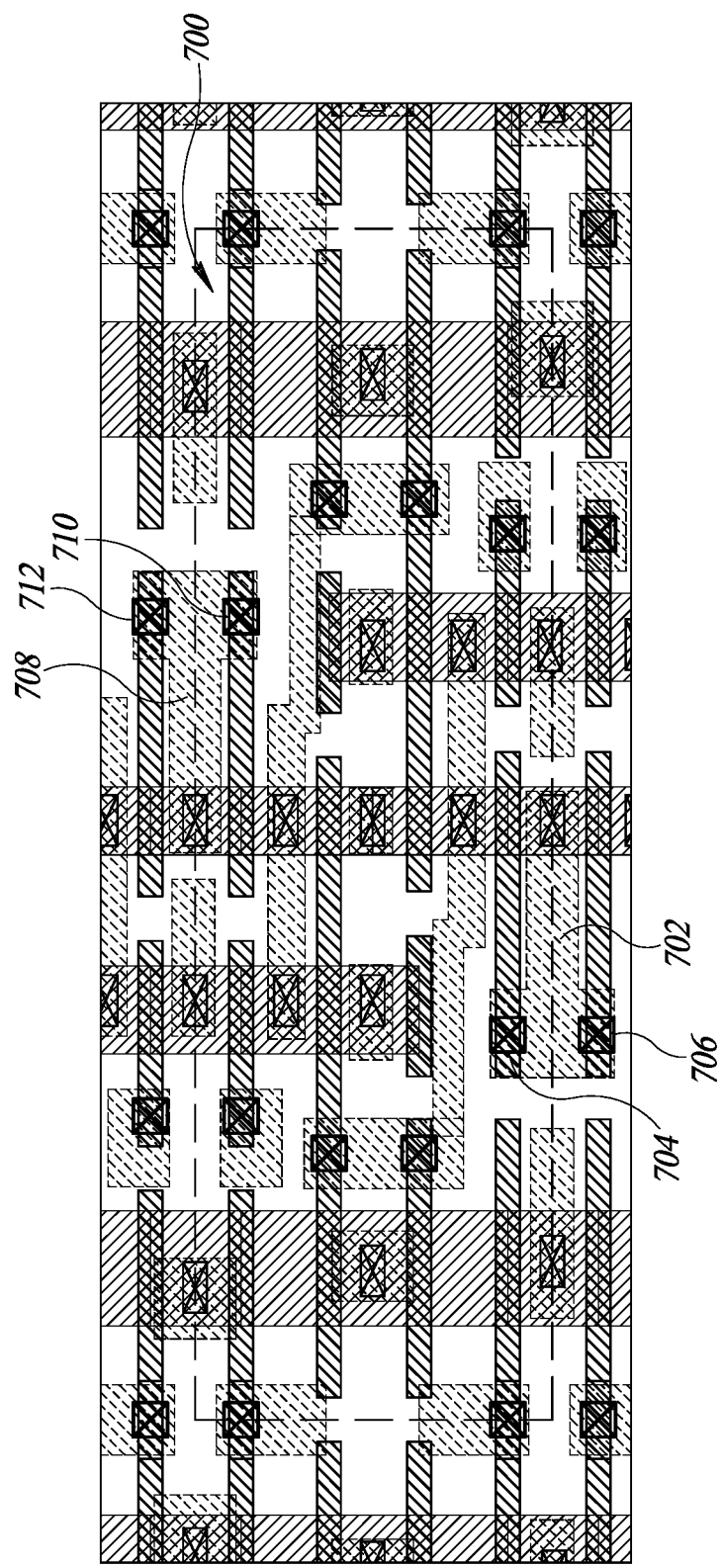
FIG. 7 is a second layout of the second SRAM cell of FIG. 6.

FIG. 7 shows a layout 700 of the SRAM cell 600 and partial layouts of the SRAM cells 604 and 606 according to one or more embodiments. The layout 700 includes regions other than the active regions and gate regions discussed with respect to FIGS. 3 and 6 and includes interconnections between different regions. The layout 700 includes a set of metal regions disposed in a layer separate than the active region layer and the gate region layer.

The layout 700 includes a first metal region 702 coupled to the third active contact 650. A gate contact 704 is coupled to the third gate region 620 of the SRAM cell 600 and a gate contact 706 is coupled to the gate region 644 of the second SRAM cell 604. The first metal region 702 is coupled to the gate contact 704 and the gate contact 706. The first metal region 702 connects the signal provided at the third active contact 650 to a gate terminal of the transistor 648 and a gate terminal of the third transistor 624.

The layout includes a second metal region 708 coupled to the fourth active contact 658. A gate contact 710 is coupled to the fourth gate region 626 of the SRAM cell 600 and a gate contact 712 is coupled to the gate region 652 of the third SRAM cell 606. The second metal region 708 is coupled to the gate contact 710 and the gate contact 712. The second metal region 708 connects the signal provided at the fourth active contact 658 to a gate terminal of the transistor 656 and a gate terminal of the fourth transistor 630.

The SRAM cell 600 and the layout 700 are substantially similar to the SRAM cell 300 and the layout 400 in other respects so further description thereof is omitted for brevity.

Figure 8:
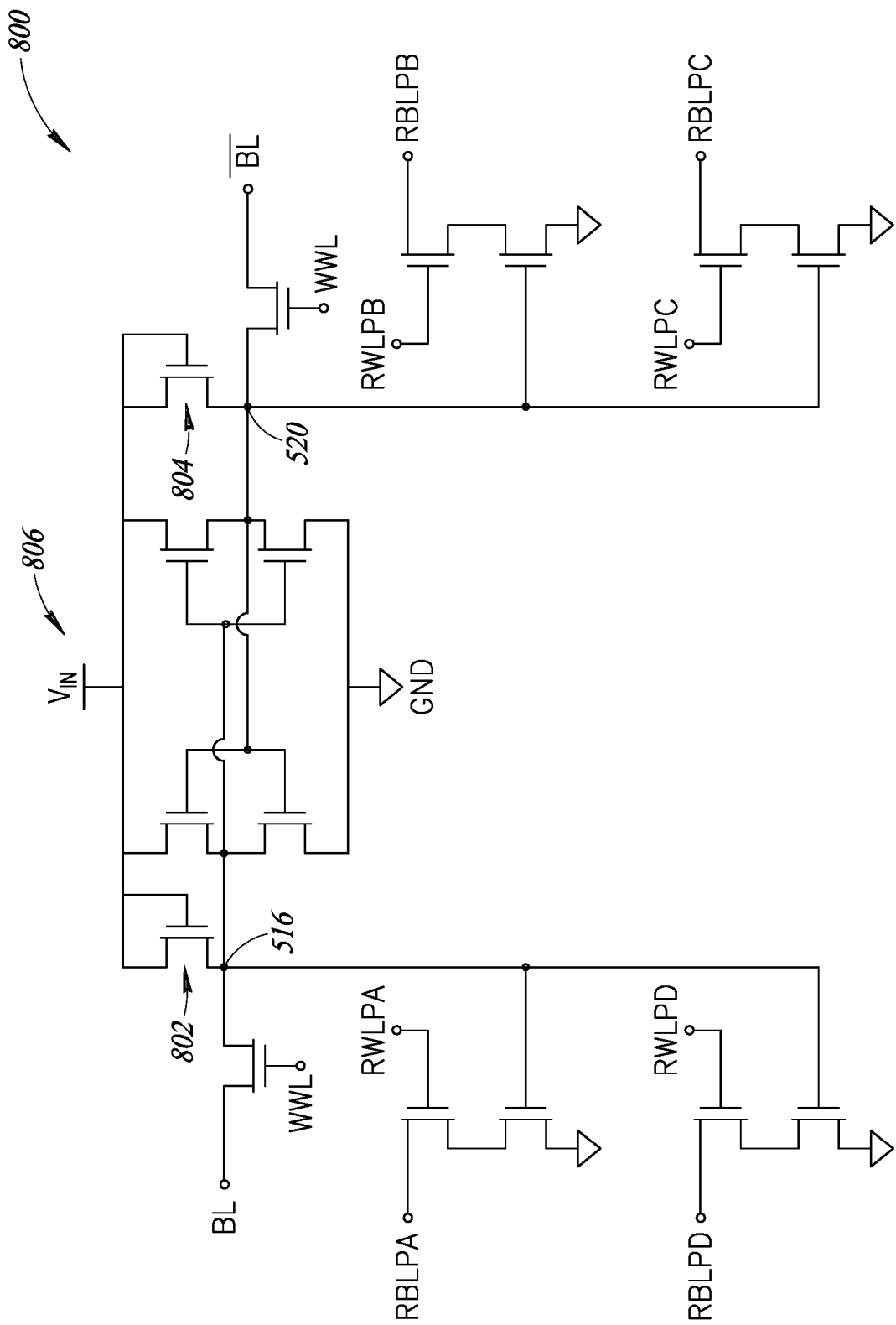
FIG. 8 is a schematic diagram of the second SRAM cell.

FIG. 8 shows a circuit 800 corresponding to the SRAM cell 600 described with respect to FIG. 6. The circuit 800 includes a fifteenth transistor 802 and a sixteenth transistor 804. The fifteenth transistor 802 is coupled between a power source 806 of the circuit 800 and the node 516. The power source 806 may be coupled, for example, to the third active contact 650. The first terminal of the fifteenth transistor 802 (e.g., source terminal) is coupled to a gate of the fifteenth transistor 802 and to the power source 806. The second terminal of the fifteenth transistor 802 (e.g., drain terminal) is coupled to the node 516. The sixteenth transistor 804 is coupled between the power source 806 and the node 520. The first terminal of the sixteenth transistor 804 (e.g., source terminal) is coupled to a gate of the sixteenth transistor 804 and to the power source 806. The second terminal of the sixteenth transistor 804 (e.g., drain terminal) is coupled to the node 520.

The fifteenth transistor 802 and the sixteenth transistor 804, in at least some embodiments, are P-channel MOSFETs. The fifteenth transistor 802 corresponds to the fourth transistor 630 and the sixteenth transistor 804 corresponds to the third transistor 624. In operation, the fifteenth transistor 802 and the sixteenth transistor 804 are dummy transistors that are biased off (i.e., an open circuit between the first terminal and the second terminal thereof) when power is applied via the power source 806. Thus, the dummy transistors do not affect operation of the SRAM cell. Beneficially, the area occupied by the SRAM cell layout is reduced while improving shallow trench isolation properties thereof as a result of the SRAM cell 600 and layout 700.

Figure 9:
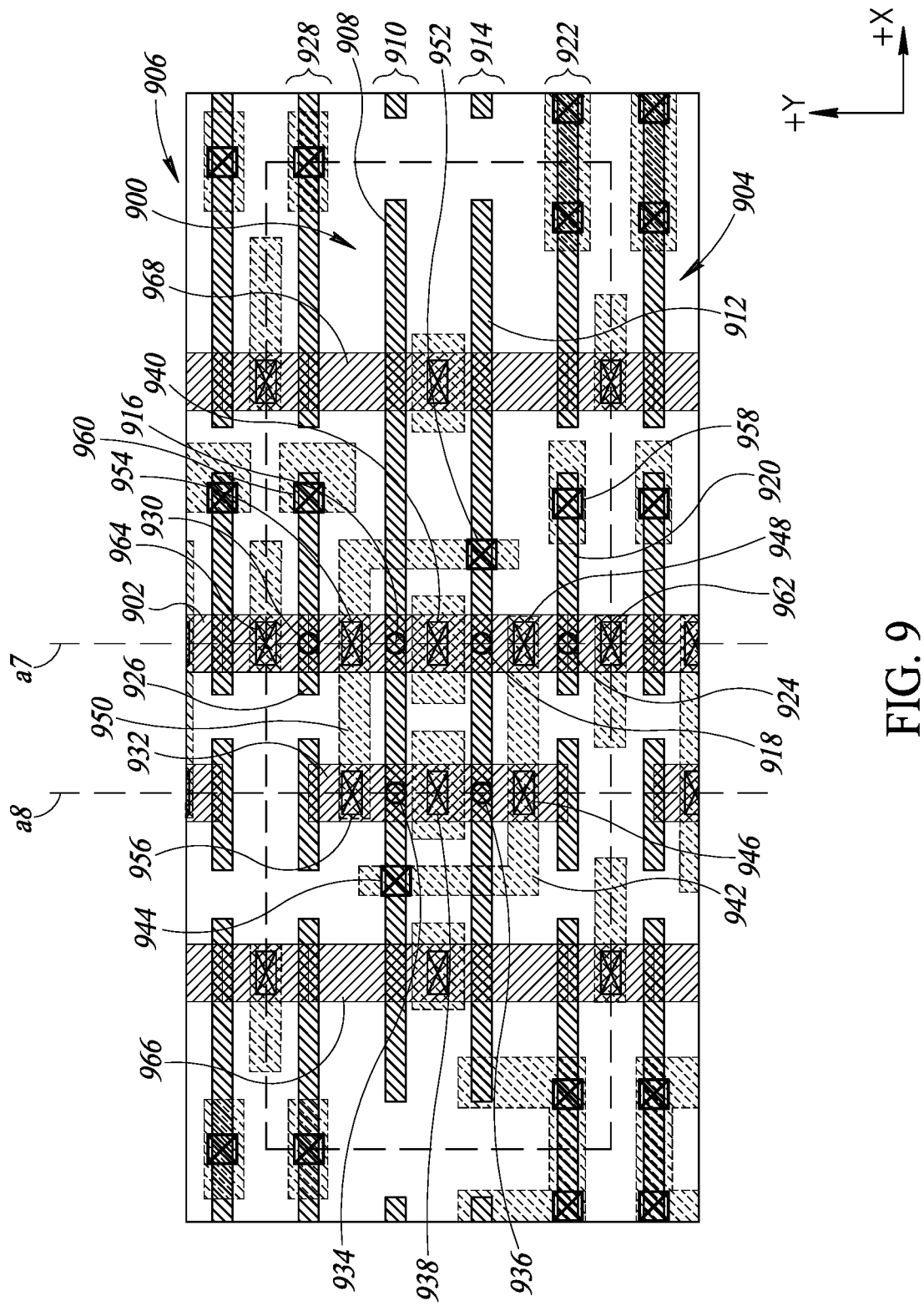
FIG. 9 is a layout diagram of a third SRAM cell according to one or more embodiments.

An area of the SRAM cell can be further reduced in some embodiments. For example, a write port of the SRAM cell may be implemented using two active regions instead of three to further reduce an area occupied by the SRAM cell. FIG. 9 shows an SRAM cell 900 according to one or more embodiments. The SRAM cell 900 includes a first active region 902 extending along an axis a7 that is parallel to the y-axis. The first active region 902 extends to overlay all of the four pitches of the SRAM cell 300. The first active region 902 extends along the axis a7 from the SRAM cell 900 to a second SRAM cell 904 adjacent to the SRAM cell 900 in a first direction (i.e., in a −y direction in parallel with the y-axis). The first active region 902 also extends along the axis a7 from the SRAM cell 900 to a third SRAM cell 906 adjacent to the SRAM cell 900 in a second direction opposite to the first direction (i.e., in a +y direction in parallel with the y-axis).

The SRAM cell 900 includes a first gate region 908 that extends along a first pitch 910 in a direction transverse to the axis a7. The SRAM cell 900 further includes a second gate region 912 that extends along a second pitch 914 in a direction transverse to the axis a7. The first gate region 908 overlays the first active region 902 to form a first transistor 916 of the SRAM cell 900. The second gate region 912 overlays the first active region 902 to form a second transistor 918 of the SRAM cell 900.

The first transistor 916 and the second transistor 918 located along the first active region 902 individually correspond to a transistor of the first inverter 502 and to a transistor of the second inverter 504 in the circuit 500 described with respect to FIG. 5 and elsewhere. The first transistor 916 may correspond to the transistor 508 of the first inverter 502 and the second transistor 918 may correspond to the transistor 512 of the second inverter 504. The first transistor 916 and the second transistor 918 are, in at least some embodiments, transistors of the same type. For instance, the first transistor 916 and the second transistor 918 may be n-type MOSFETs or pull-down transistors.

The SRAM cell 900 includes a third gate region 920 that extends along a third pitch 922 in a direction transverse to the axis a7. The third gate region 920 overlays the first active region 902 to form a third transistor 924 of the SRAM cell 900. The third transistor 924 corresponds to a pass gate transistor for controlling a write operation of the SRAM cell 900. For instance, the third transistor 924 may correspond to the fifth transistor 514 or the sixth transistor 518 of the circuit 500.

The SRAM cell 900 includes a fourth gate region 926 that extends along a fourth pitch 928 in a direction transverse to the axis a7. The fourth gate region 926 overlays the first active region 902 to form a fourth transistor 930 of the SRAM cell 900. The fourth transistor 930 corresponds to the other pass gate transistor of the circuit 500 for controlling a write operation of the SRAM cell 900. For instance, the fourth transistor 930 may correspond to the fifth transistor 514 or the sixth transistor 518 of the circuit 500.

The SRAM cell 900 further includes a second active region 932 extending transversely along an axis a8 and being separate and laterally spaced apart from the first active region 902. The second active region 932 extends to overlay a proper subset of the four pitches of the SRAM cell 900. The second active region 932 overlays the first gate region 908 to form a fifth transistor 934 of the SRAM cell 900 and overlays the second gate region 912 to form a sixth transistor 936 of the SRAM cell 900.

The fifth transistor 934 and the sixth transistor 936 located along the second active region 932 individually correspond to a transistor of the first inverter 502 and to a transistor of the second inverter 504 in the circuit 500. The fifth transistor 934 may correspond to the transistor 506 of the first inverter 502 and the sixth transistor 936 may correspond to the transistor 510 of the second inverter 504. The fifth transistor 934 and the sixth transistor 936 are, in at least in some embodiments, transistors of the same type. The fifth transistor 934 and the sixth transistor 936 may be transistors of a different type than the first transistor 916 and the second transistor 918. Further to the example provided above with respect to the first and second transistors 916 and 918, the fifth transistor 934 in the sixth transistor may be p-type MOSFETs or pull-up transistors that are complementary to the n-type MOSFETs or pull-down transistors of the first and second transistors 916 and 918.

The first transistor 916 and the fifth transistor 934 collectively form an inverter of the circuit 500, such as the first inverter 502. The second transistor 918 and the sixth transistor 936 collectively form the other inverter of the circuit 500, such as the second inverter 504.

The first transistor 916, the second transistor 918, the fifth transistor 934, and the sixth transistor 936 collectively form a pair of cross-coupled inverters for storing a bit of data, as described herein. The third transistor 924 and the fourth transistor 930 correspond to pass gates for controlling a write operation of the SRAM cell 900.

The SRAM cell 900 includes a first active contact 938 coupled to the second active region 932 between the fifth transistor 934 and the sixth transistor 936. The first active contact 938 may be coupled to a line for providing power or ground to terminals of the fifth transistor 934 and the sixth transistor 936. For instance, the first active contact 938 may be coupled to a line that provides a power supply signal (e.g., +5 VDC) to source terminals of the fifth transistor 934 and the sixth transistor 936. The SRAM cell 900 also includes a second active contact 940 coupled to the first active region 902 between the first transistor 916 and the second transistor 918. The second active contact 940 may be coupled to a signal line for providing power or ground to terminals of the first transistor 916 and the second transistor 918—for example, the second active contact 940 may be connected to a line providing a power ground (0 VDC) to drain terminals of the first transistor 916 and the second transistor 918.

In an embodiment wherein the first active contact 938 is coupled to a line that provides the power supply signal and the second active contact 940 is coupled to a signal line that provides the power ground, the first transistor 916 and the second transistor 918 are pull-down transistors whereas the fifth transistor 934 and the sixth transistor 936 are pull-up transistors. However, these transistor types may be different depending on the signal on the line coupled to the first active contact 938 and the signal on the line coupled to the second active contact 940.

The SRAM cell 900 includes a first metal region 942 for cross-coupling gate terminals of the fifth transistor 934 and the first transistor 916 with terminals of the sixth transistor 936 and the second transistor 918. The first metal region 942 is coupled to a first gate contact 944 located outwardly of the fifth transistor 934 along the first pitch 910. The first metal region 942 is coupled to the second active region 932 via a third active contact 946 located along the axis a8 between the second pitch 914 and the third pitch 922. The first metal region 942 is also coupled to the first active region 902 via a fourth active contact 948 located along the axis a7 between the second pitch 914 and the third pitch 922.

The SRAM cell 900 includes a second metal region 950 for cross-coupling gate terminals of the second transistor 918 and the sixth transistor 936 with terminals of the fifth transistor 934 and the first transistor 916. The second metal region 950 is coupled to a second gate contact 952 located outwardly of the second transistor 918 along the second pitch 914. The second metal region 950 is also coupled to the first active region 902 via a fifth active contact 954 located along the axis a7 between the first pitch 910 and the fourth pitch 928. The second metal region 950 is also coupled to the second active region 932 via a sixth active contact 956 located along the axis a8 between the first pitch 910 and the fourth pitch 928.

The SRAM cell 900 further includes a third gate contact 958 coupled to the third gate region 920 along the third pitch 922 and located outwardly of the axis a7. The SRAM cell 900 includes a fourth gate contact 960 coupled to the fourth gate region 926 along the fourth pitch 928 and located outwardly of the axis a7. One or more lines may be coupled to the third gate contact 958 and the fourth gate contact 960 for providing a signal that controls a write operation for the SRAM cell 900—for example, a signal provided over the WWLs.

A seventh active contact 962 is coupled to the first active region 902 outwardly of the third transistor 924 along the axis a7 below the third pitch 922. An eighth active contact 964 is coupled to the first active region 902 outwardly of the fourth transistor 930 along the axis a7 above the fourth pitch 928. One or more lines, such as a write bit line and a complementary write bit line, may be coupled to the seventh active contact 962 and the eighth active contact 964 for writing a bit of data to the SRAM cell 900.

The SRAM cell 900 may include a third active region 966 extending in parallel with the axis a7 and may include a fourth active region 968 extending in parallel with the axis a7. The third active region 966 and/or the fourth active region 968 may overlay with gate regions along the first pitch 910, the second pitch 914, the third pitch 922, and/or the fourth pitch 928 to form transistors of one or more read ports, as described elsewhere herein. The third active region 966 may be spaced apart from and located outwardly of the second active region 932 on a first side of the SRAM cell 900. The fourth active region 968 may be spaced apart from and located outwardly of the first active region 902 an a second side of the SRAM cell opposite to the first side.

An area occupied by the SRAM cell 900 is approximately 20% (19.5%) less than the area occupied by a memory cell implementing the layout 100. The SRAM cell 900 is otherwise substantially similar to other SRAM cells described herein so further description thereof is omitted for brevity.

Figure 10:
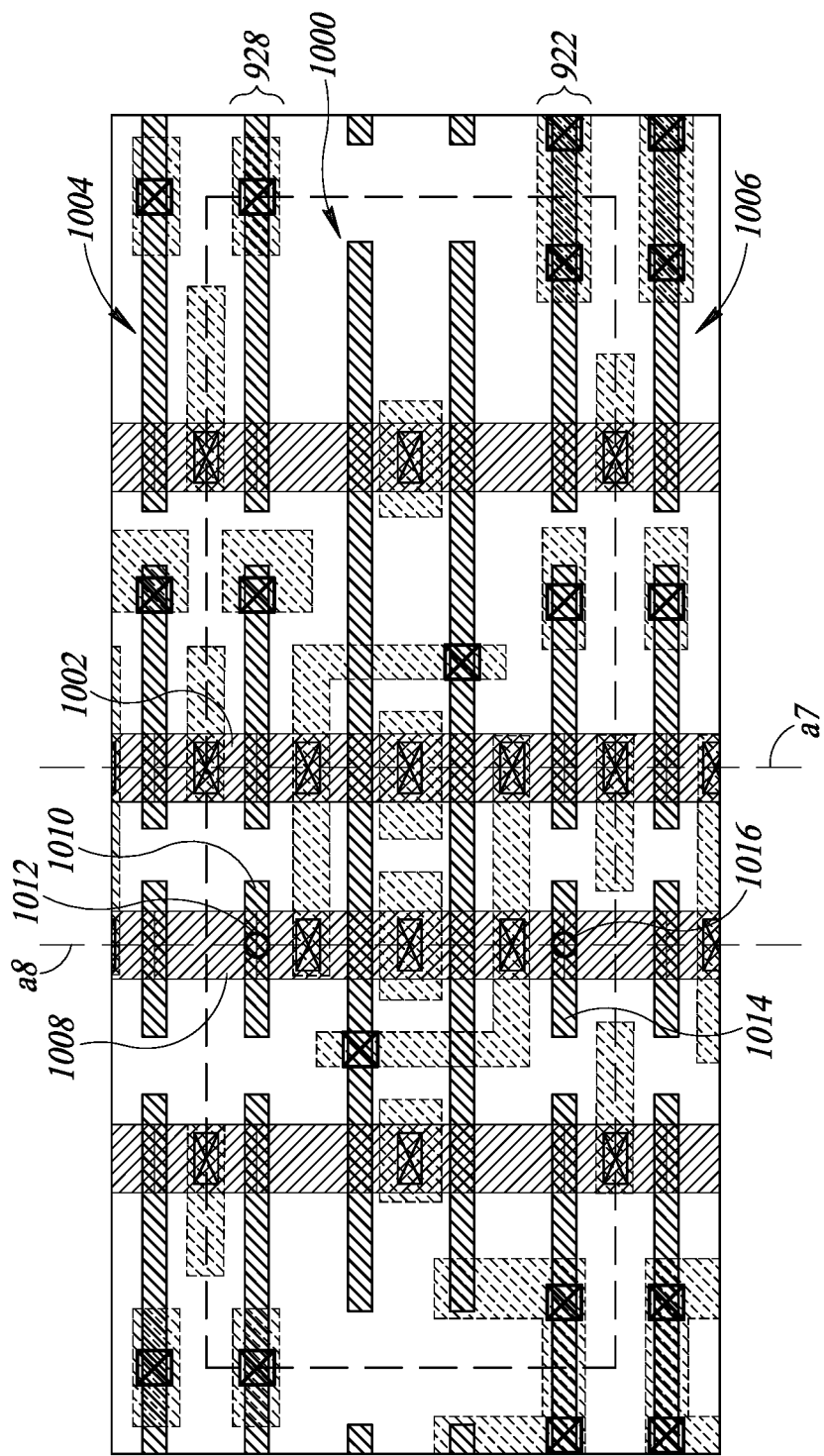
FIG. 10 is a layout diagram of a fourth SRAM cell according to one or more embodiments.

FIG. 10 shows a SRAM cell 1000 in which both active regions are continuous between adjacent SRAM cells. In particular, a first active region 1002 extends from the SRAM cell 1000 along the axis a7 (described above with respect to FIG. 9) into a first SRAM cell 1004 adjacent to the SRAM cell 1000 and into a second SRAM cell 1006 adjacent to the SRAM cell 1000. A second active region 1008 extends from the SRAM cell 1000 along the axis a8 (described above with respect to FIG. 9) into the first SRAM cell 1004 and into the second SRAM cell 1006. As shown, the first active region 1002 is separate and spaced apart from the second active region 1008 in a direction transverse to the axes a7 and a8.

The SRAM cell 1000 includes a fifth gate region 1010 that overlays the second active region 1008 at a location along the fourth pitch 928 to form a seventh transistor 1012. The SRAM cell 1000 also includes a sixth gate region 1014 that overlays the second active region 1008 located along the third pitch 922 to form an eighth transistor 1016. The seventh transistor 1012 and the eighth transistor 1016 are dummy transistors that do not affect operation of the circuit 500. However, as described with respect to the SRAM cell 600, the continuous second active region 1008 facilitate improved shallow trench isolation properties that, for example, reduce or prevent current leakage in the SRAM cell 1000.

The SRAM cell 1000 is otherwise substantially similar to other SRAM cells described herein, and operates as described herein with respect to the circuits 500 and 700, so further description thereof is omitted for brevity.

Beneficially, the layouts disclosed herein substantially reduce the area occupied by an SRAM cell or an array of SRAM cells. In previous implementations, shallow trench isolation characteristics have been demonstrated to adversely impact performance, such as write speed and power consumption. The SRAM cell layouts described herein improve performance of the SRAM cell by mitigating the effects of shallow trench isolation. According to at least some models, SRAM cells described herein improve write times for writing data to an SRAM cell and also reduce power consumption associated with write operations.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory cell, comprising:
a pair of cross-coupled inverters including:
 a first transistor that includes a first active region extending along a first axis and a first gate region extending transversely to the first axis and overlaying the first active region;
 a second transistor that includes a second gate region extending transversely to the first axis and overlaying the first active region, the second gate region being spaced apart from the first gate region along the first axis;
 a third transistor that includes a second active region extending along a second axis and overlaying the first gate region, wherein the first active region extends across a first edge of the memory cell and a second edge of the memory cell opposite to the first edge; and
 a fourth transistor that includes a third active region extending along a third axis and overlaying the second gate region;
a dummy transistor including a third gate region that overlays the first active region, the third gate region located adjacent to the first edge; and
a first read port that includes a fourth active region extending along a fourth axis, the fourth active region overlaying the first gate region.

2. The memory cell of claim 1, further comprising:
a fifth transistor positioned adjacent to a first edge of the memory cell, the fifth transistor including a fourth gate region overlaying the second active region along the second axis; and
a sixth transistor positioned adjacent to a second edge of the memory cell opposite to the first edge, the sixth transistor including a fifth gate region overlaying the third active region along the third axis.

3. The memory cell of claim 2 wherein the fifth transistor and the sixth transistor are write word line transistors of the memory cell.

4. The memory cell of claim 2 wherein the first gate region is located along a first pitch of gate regions and the second gate region is located along a second pitch of gate regions, and
wherein the fourth gate region is located along a third pitch of gate regions and the fifth gate region is located along a fourth pitch of gate regions.

5. The memory cell of claim 1 wherein the first transistor and the third transistor are located along a first pitch of gate regions, and the second transistor and the fourth transistor are located along a second pitch of gate regions.

6. The memory cell of claim 1 wherein the first active region is located between the second active region and the third active region.

7. The memory cell of claim 1, comprising:
a second read port that includes a fifth active region extending along a fifth axis and overlaying the second gate region, the third transistor is located between the first transistor and a transistor of the first read port along a first pitch of gate regions, and the fourth transistor is located between the second transistor and a transistor of the second read port along a second pitch of gate regions.

8. A memory cell, comprising:
a first memory cell having a first pair of cross-coupled inverters that include:
 a first transistor including a first active region that extends along a first axis and including a first gate region that extends transversely to the first axis and that overlays the first active region;
 a second transistor including a second gate region that extends transversely to the first axis and that overlays the first active region, the second gate region being spaced apart from the first gate region along the first axis;
 a third transistor that includes a second active region extending along a second axis and overlaying the first gate region; and
 a fourth transistor that includes a third active region extending along a third axis and overlaying the second gate region, wherein the first active region extends across a first edge of the memory cell and a second edge of the memory cell opposite to the first edge; and a dummy transistor including a third gate region that overlays the first active region, the third gate region located adjacent to the first edge.

9. The memory cell of claim 8, comprising a first read port that includes a fourth active region extending along a fourth axis, the fourth active region overlaying the first gate region.

10. The memory cell of claim 9, further comprising:
a fifth transistor positioned adjacent to a first edge of the memory cell, the fifth transistor including a fourth gate region overlaying the second active region along the second axis; and
a sixth transistor positioned adjacent to a second edge of the memory cell opposite to the first edge, the sixth transistor including a fifth gate region overlaying the third active region along the third axis.

11. The memory cell of claim 10 wherein the fifth transistor and the sixth transistor are write word line transistors of the memory cell.

12. The memory cell of claim 10 wherein the first gate region is located along a first pitch of gate regions and the second gate region is located along a second pitch of gate regions, and
wherein the fourth gate region is located along a third pitch of gate regions and the fifth gate region is located along a fourth pitch of gate regions.

13. The memory cell of claim 9, wherein the first transistor and the third transistor are located along a first pitch of gate regions, and the second transistor and the fourth transistor are located along a second pitch of gate regions.

14. The memory cell of claim 9 wherein the first active region is located between the second active region and the third active region.

15. The memory cell of claim 9, comprising a second read port that includes a fifth active region extending along a fifth axis and overlaying the second gate region, the third transistor is located between the first transistor and a transistor of the first read port along a first pitch of gate regions, and the fourth transistor is located between the second transistor and a transistor of the second read port along a second pitch of gate regions.

16. A memory cell, comprising:
a write port including:
    a first transistor that includes a first active region extending along the first axis, the first active region overlaying a first gate region in a first pitch;
    a second transistor that includes the first active region and a second gate region that overlays the first active region in a second pitch; and
    a third transistor that includes a second active region extending along a second axis parallel to the first axis and spaced apart from the first active region, the second active region overlaying the first gate region in the first pitch, the second active region extends across a first edge of the memory cell; and
one or more read ports including:
    a first read port transistor that includes a third active region extending along a third axis parallel to the first axis and spaced apart from the second active region, the third active region overlaying a gate region in the first pitch; and
a dummy transistor located to the first edge, the dummy transistor including the second active region and a third gate region that overlays the second active region in a third pitch.

17. The memory cell of claim 16 wherein the first active region extends across the first edge of the memory cell.

18. The memory cell of claim 16 wherein the write port includes:
a write word line transistor that includes a fourth active region extending along a fourth axis parallel to the first axis and spaced apart from the first active region, the fourth active region overlaying a fourth gate region in a fourth pitch.

19. The memory cell of claim 16 wherein the write port includes the second active region and the second gate region overlaying the second active region in the second pitch; and the one or more read ports include a second read port transistor that includes a fourth active region extending along a fourth axis and spaced apart from the first active region on a side opposite to the third active region, the fourth active region overlaying with a gate region in the second pitch.

20. The memory cell of claim 16 wherein the write port includes a write word line transistor that includes the second active region.

* * * * *

UNITED STATES PATENT AND TRADEMARK OFFICE
CERTIFICATE OF CORRECTION

| | |
|---|---|
| PATENT NO. | : 11,758,707 B2 |
| APPLICATION NO. | : 17/118372 |
| DATED | : September 12, 2023 |
| INVENTOR(S) | : Shafquat Jahan Ahmed et al. |

It is certified that error appears in the above-identified patent and that said Letters Patent is hereby corrected as shown below:

In the Claims

Column 22, Claim 16, Line 18:
"located to the first"
Should read:
--located adjacent to the first--.

Signed and Sealed this
Twenty-first Day of November, 2023

Katherine Kelly Vidal
*Director of the United States Patent and Trademark Office*